US007129979B1

(12) United States Patent
Lee

(10) Patent No.: US 7,129,979 B1
(45) Date of Patent: Oct. 31, 2006

(54) IMAGE SENSOR PIXEL FOR GLOBAL ELECTRONIC SHUTTERING

(75) Inventor: Paul P. Lee, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/562,712

(22) Filed: Apr. 28, 2000

(51) Int. Cl.
*H04N 3/14* (2006.01)
(52) U.S. Cl. .................. 348/308; 348/296
(58) Field of Classification Search ......... 257/356, 257/231, 291, 292, 443, 444; 438/157; 348/302, 348/308, 296; 250/208.1
See application file for complete search history.

(56) References Cited

U.S. PATENT DOCUMENTS

| | | | | |
|---|---|---|---|---|
| 3,845,295 | A * | 10/1974 | Williams et al. | 257/224 |
| 4,322,638 | A | 3/1982 | Lee et al. | 307/311 |
| 5,631,703 | A | 5/1997 | Hamilton, Jr. et al. | 348/273 |
| 5,789,774 | A * | 8/1998 | Merrill | 257/292 |
| 5,898,168 | A | 4/1999 | Gowda et al. | |
| 5,952,686 | A | 9/1999 | Chou et al. | |
| 6,046,444 | A | 4/2000 | Afghahi | |
| 6,160,282 | A * | 12/2000 | Merrill | 257/292 |
| 6,173,894 | B1 * | 1/2001 | Olmstead et al. | 235/462.17 |
| 6,466,266 | B1 * | 10/2002 | Guidash et al. | 348/308 |
| 6,469,332 | B1 * | 10/2002 | Berezin | 257/292 |
| 6,507,011 | B1 * | 1/2003 | Ang | 250/208.1 |
| 6,556,244 | B1 * | 4/2003 | So et al. | 348/296 |
| 6,624,850 | B1 * | 9/2003 | Guidash | 348/308 |
| 6,667,768 | B1 * | 12/2003 | Fossum | 348/308 |

OTHER PUBLICATIONS

"A Solid-State Image Sensor for Image Recording at 2000 Frames Per Second" by Teh-Huang Lee, et al., *IEEE Transactions On Electron Devices*, vol. ED-19, No. 9, Sep. 1982, pp. 1469-1477.

(Continued)

*Primary Examiner*—Tuan Ho
*Assistant Examiner*—Timothy J. Henn
(74) *Attorney, Agent, or Firm*—Peyton C. Watkins

(57) ABSTRACT

A pixel design for CMOS image sensors that has a high frame rate potential and, therefore, provides motion capture capabilities. The pixel is designed for global electronic shuttering so every pixel is exposed simultaneously to images incident upon the pixel array plane. The present invention has the advantages of: (1) Allowing the accommodation of changes in the pixel output groupings for different monochrome output format or CFA patterns with only changes in metal routing layers; (2) allowing true electronic shuttering to image moving scene with all the pixels having the same capture time windows; and (3) providing a symmetric global shutter gate and transfer gate to minimize pixel related fixed pattern noise. The pixel architecture provides for a CMOS based, active pixel image sensor comprising an array of pixels formed in rows and columns, with each of the pixels containing at least one active circuit element. There are a plurality of output channels formed such that each of the output channels are operatively connected to a subset of pixels wherein each of the pixel have an attribute that is the same. The pixel architecture also provides an output gate region and a shutter gate region that are symmetric about the center of the pixel. By arranging the shutter and transfer gates, a symmetric manner about the center of the pixel, a more efficient transfer of electrons to these gates is provided. A Pixel Output Bus structure allows configurable connections to column-wise signal busses that provide parallel output channels.

23 Claims, 6 Drawing Sheets

OTHER PUBLICATIONS

"Color Filters and Processing Alternatives for One-Chip Cameras", by Kenneth A. Parulski, *IEEE Transactions on Electron Devices*, vol. ED-32, No. 8, Aug. 1985, pp. 1381-1389.

"KHS-0197 512 (H) x 384 (V) Pixel, High Speed Interline CCD Image Sensor Performance Specification", *Eastman Kodak Company, Microelectronics Technology Division*, Rochester, New York, Revision 1, Jul. 20, 1998.

E. Eid, "Design of Radiation Hard CMOS APS Image Sensors For Space Applications", *7th National Radio Science Conference*, Feb. 22-24, 2000, D5, pp. 1-9.

S. Lauxtermann et al., "A High Speed CMOS Imager Acquiring 5000 Frames/Sec", *Electron Devices Meeting, 1999, IEDM Technical Digest, IEEE, US*, Dec. 1999, pp. 875-878.

Chye Huat Aw et al., "A 128×128-Pixel Standard-CMOS Image Sensor With Electronic Shutter", *1996 IEEE International Solid-State Circuits Conference*, pp. 180-181 and 440.

* cited by examiner

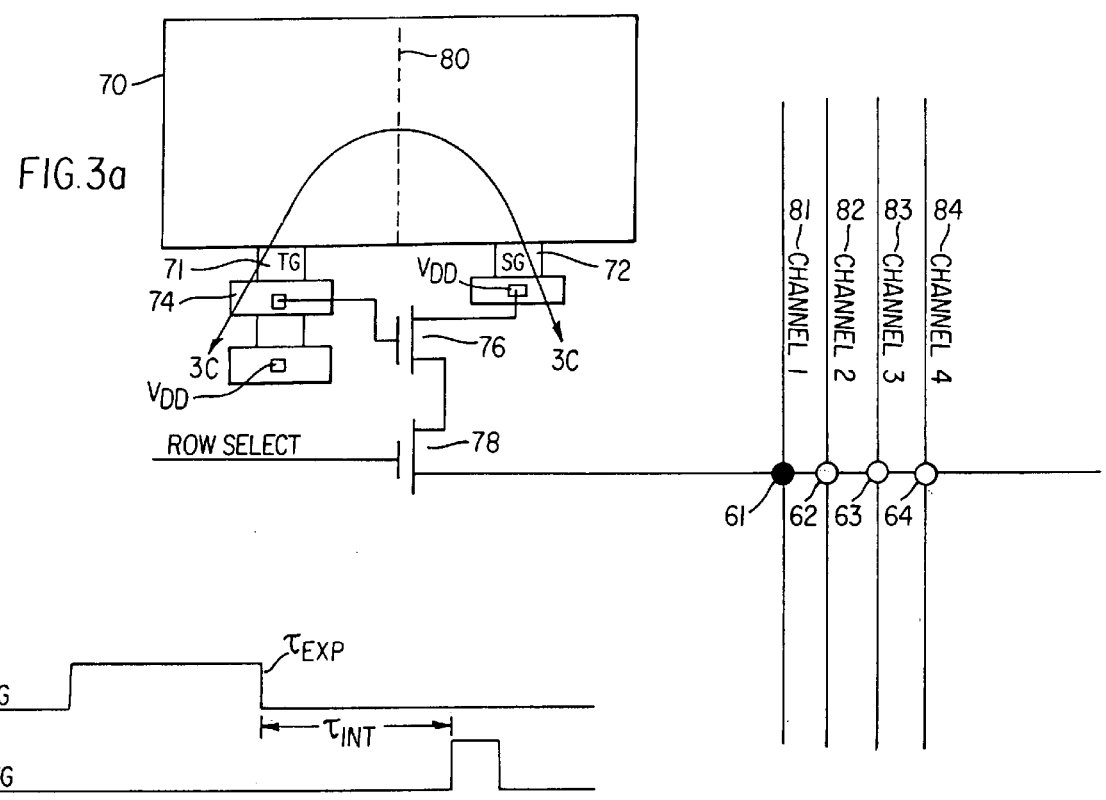

IMAGE SENSOR PIXEL FOR GLOBAL ELECTRONIC SHUTTERING

BACKGROUND OF THE INVENTION

1. Field of the Invention

The present invention relates to the field of solid-state image sensing devices and, more specifically, to CMOS based active pixel sensors.

2. Description of the Prior Art

CMOS active pixel image sensors have been rapidly developed to supplement and replace charge-coupled devices in many applications. CMOS image sensors have advantages in low-power operation as well as the higher integration capabilities for on-chip signal processing and control functions that are available with CMOS technology. Therefore, the technology is suitable for many consumer applications, including low-cost portable imaging devices. CMOS based sensors allow for the incorporation of numerous functions onto a single chip. Various prior art references have disclosed Active Pixel Sensors based on CMOS that employ sense node connected to photodetectors through transfer gates. Typically a reset gate is provided that can be used for shuttering purposes. However, in the application areas of industrial cameras and high-frame rate recording, CMOS sensors have been handicapped by embodiments which employ row-by-row exposure controls which allows a slit shuttering mode that is not capable of simultaneous exposure of the entire CMOS pixel array. An additional shutter gate is added to provide direct reset of the photodetector independent of the transfer gate. However, the addition of the gate may cause increased fixed pattern noise due to non-optimal removal rates for charges stored within the photodetectors in the prior art devices.

From the foregoing discussion, it should be readily apparent that there remains a need within the art for a CMOS based Active Pixel Sensor design that provides for independent electronic shuttering while providing optimal removal rates for charges stored within the photodetectors.

SUMMARY OF THE INVENTION

The present invention addresses the shortcomings within the prior art by providing a pixel design for CMOS image sensors that has a high frame rate potential and, therefore, provides freeze-frame motion capture capabilities. The pixel architecture provides for a CMOS based, active pixel image sensor comprising an array of pixels formed in rows and columns, with at least a subset of the pixels having a symmetrical arrangement of a shutter gate and a transfer gate to allow for more efficient removal of electrons from the photodetector. The pixel architecture provides an output gate region and a shutter gate region that are asymmetric about the electrostatic center of the pixel. By arranging the shutter and transfer gates, a symmetric manner about the center of the pixel, transfers of electrons to these gates are identical in both paths so that fixed pattern noise is minimized. A Pixel Output Bus structure also allows configurable connections to column-wise signal busses for connections to parallel output channels. The pixel is designed for global electronic shuttering so every pixel is exposed simultaneously to images incident upon the pixel array plane. This present invention is intended for use in a high frame rate image sensor that is fabricated using a Complementary Metal Oxide Semiconductor (CMOS) active pixel sensor (APS) technology and preferably incorporating a pinned photo-diode.

The pixel architecture also provides a plurality of output channels formed such that each of the output channels are operatively connected to a subset of pixels wherein each of the pixels have an attribute that is the same.

Advantages

The present invention has the advantages of: (1) Allowing the accommodation of changes in the pixel output groupings for different monochrome output format or CFA patterns with only changes in metal routing layers; (2) allowing true electronic shuttering to image moving scene with all the pixels having the same capture time windows; and (3) providing a symmetric global shutter gate and transfer gate to minimize pixel-related fixed pattern noise.

BRIEF DESCRIPTION OF THE DRAWINGS

FIG. 3*a* block diagram of the high frame rate pixel design showing the symmetry of the transfer gate and the shutter gate as well as the Pixel Output Bus and its configurable connection to the output bus;

FIG. 3*b* is a schematic view of a cross-sectional area of the pixel shown in FIG. 3*a* through the shutter gate, center of the pixel, and the transfer gate showing the electrostatic potential;

DESCRIPTION OF THE PREFERRED EMBODIMENT

Figure 1:
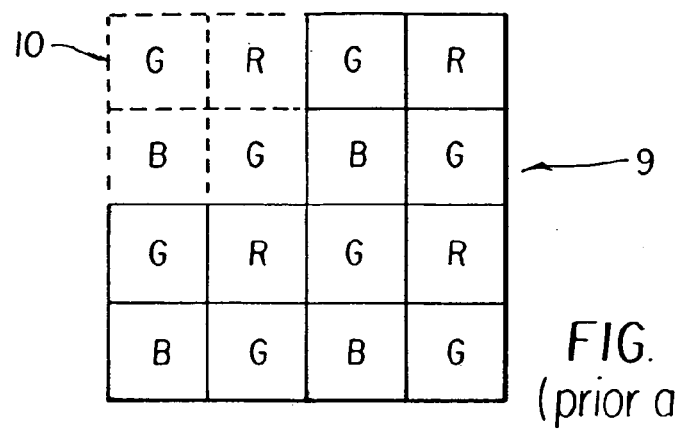
FIG. 1 is a segment of the Bayer CFA pattern design showing the four-pixel unit kernel.

FIG. 1 is an example of a unit kernel 10 known as the Bayer CFA pattern design showing the four-pixel unit kernel 10 wherein G=green, R=red, and B=blue shows the color sensitivity of the pixels. The 2×2 pattern illustrated in the unit kernel 10 is a conventional prior-art image sensor construction. The photo-electric conversion means, such as a photo-diode, is formed in a semi-conductor layer during processing steps of forming various parts of the active device. These processing steps typically include photolithographical masking, ion implantation, diffusion and oxidation. The various parts of the active device are commonly a photodetector using either photo-diode or photogate technology, source/gate/drain of Metal Oxide Semiconductor Field Effect Transistors (MOSFET's), and isolation regions. Additionally, poly-silicon and silicon oxide layers are deposited, patterned and formed on the semi-conductor layers to form transistors. Finally, layers of isolation dielectric are overlaid between the semiconductor active devices and metal wiring layers which are patterned to connect the devices to form circuits to carry out specific electronic functions. In the fabrication of an image sensor, additional layers are used to form Color Filter Array (CFA) and micro-lens. The CFA layer consists of mosaic of a CFA kernel repeated over the imaging pixel array. Each kernel contains patterned pixel areas with specific color so each of the photo-sensing element underneath sees only light rays of one specific color only.

In a high frame rate image sensor where effective pixel output rates reach into the 100's of millions of pixels per second, multiple parallel channels are employed. A reference that discusses such sensors is *A Solid-State Image Sensor for Image Recording at* 2000 *Frames Per Second*, by T-H Lee, T. J. Tredwell, B. C. Burkey, C. Anagnostopoulos, J. S. Hayward, T. M. Kelly, R. P. Khosla, D. L. Losee, and J. P. Lavine in IEEE Transactions on Electronic Devices, Vol. ED-19, No. 9, pp. 1469–1477, September 1982. This prior art reference (as well as others) teaches multiple parallel channels arranged according to location within the sensor.

FIG. 3a is a block diagram of the high frame rate pixel design wherein a line of symmetry 80 can be drawn that, essentially, divides the pixel into two equal halves. A transfer gate 71 and a shutter gate 72 are formed within the pixel such that the location of the transfer gate 71 is an equal distance from the center of the pixel as the shutter gate 72. The placement of the shutter gate 72 and the transfer gate 71 are not only equidistant from the center of the pixel but are symmetrically placed about the line of symmetry 80. This provides for superior drainage of the electrons from the pixel which is useful in high speed devices, such as the multiple channel device of the present invention. The layout of the shutter gate 72 and the transfer gate 71 about the line of symmetry 80 within pixel 70 does not have to be as shown in FIG. 3a. Any pixel design that can place a shutter gate and a transfer gate such that they are equal distances from the center can essentially have a line of symmetry drawn between the shutter and transfer gates. This is very apparent with pixel design having photodetectors that are shaped in square, rectangular, circular and oval configurations. The Pixel Output Bus within the preferred embodiment would typically have a select transistor which connects to either one of the four column bus for channels 1, 2, 3 or 4 (81, 82, 83, 84) with only backend metal via mask layer changes by selectively making contact between the pixel output bus to one of the four column bus using one of the contacts/vias 61, 62, 63 or 64. By changing these masks which are late in the processing sequence, the sensor can is configurable for different CFA patterns.

FIG. 3b shows the timing for the shuttering and integration periods of the pixel 70 seen in FIG. 3a. The shutter gate 72 will be active prior the time $\tau_{Exp}$ in order to reset pixel 70 to a predetermined potential, which in the case of the preferred embodiment is VDD. This effectively is the shutter operation to the pixel 70. At time $\tau_{Exp}$, the signal SG to the shutter gate 72 go inactive and the integration period $\tau_{INT}$ begins. Once the integration period for the pixel is complete, the transfer gate signal TG pulses transferring the photoelectrons from the pixel onto the floating diffusion 74. The floating diffusion 74 acts as an input to the gate of source follower transistor 76 which provides amplification that is enabled by row select transistor 78.

In the organization of high speed sensors with multiple parallel output channels, it is desirable to dedicate a single channel to a specific attribute, such as color or sensitivity, since the sensitivity of the pixel is dependent upon these attributes. The channel electronics can then be optimized for the specific attribute, for example the electronic gain is set to an optimal level. Therefore, all pixels of the same attribute are connected to one output channel using a dedicated connection matrix and the pixels having that attribute are hard-wired to the output channel of choice. That output channel then has electronics specific to the attribute being output on that output channel.

In the present invention, the pixel has an output bus region which allows the determination of the final connections by changes in the metal/via/contact layers only. Therefore, the output channel assignments can be modified for different CFA patterns with minimal costs associated with metal/via/contact masking steps in the manufacturing process. This is illustrated in FIGS. 2a–d and 3a–c for a four-channel implementation with either a two or a four output column bus.

Figure 2A:
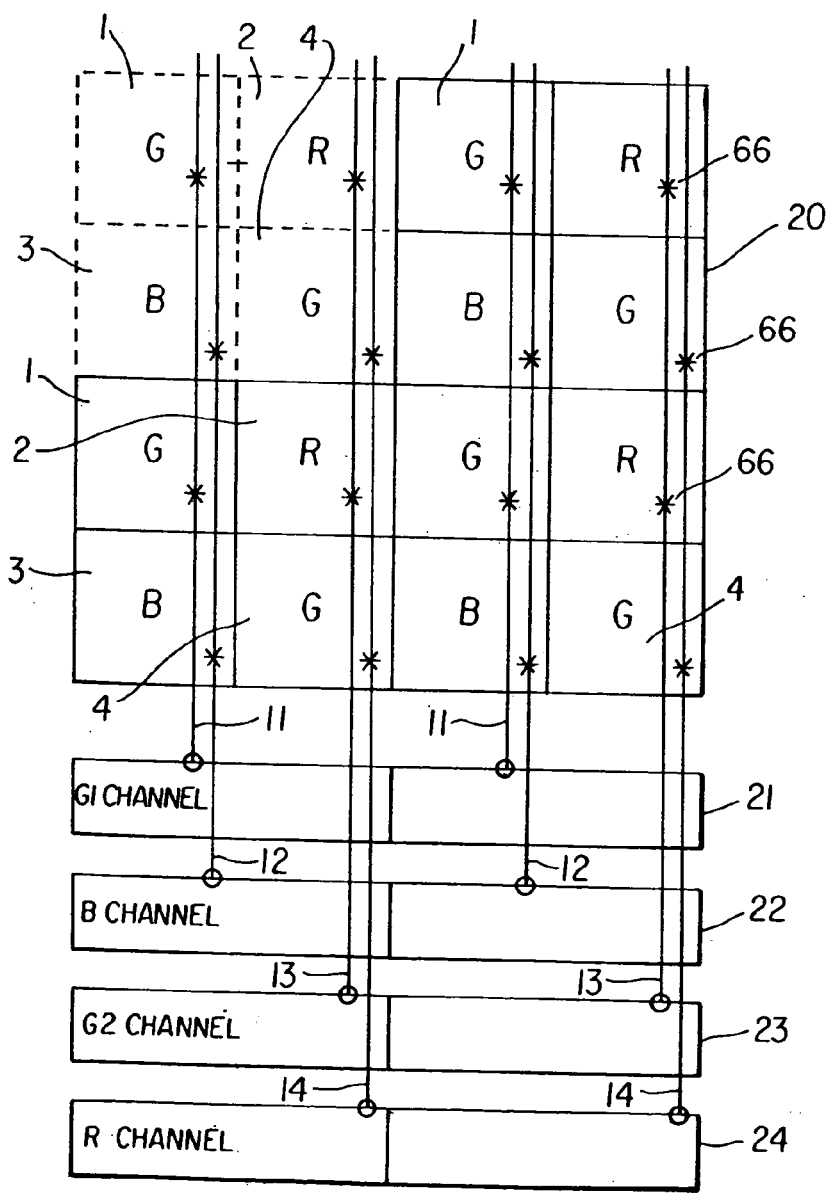
FIG. 2*a* is a block diagram representation of the parallel output channels connected to a CFA kernel of four pixels similar to the Bayer pattern shown in FIG. 1.

FIG. 2a is a block diagram representation of the present invention wherein image sensor 20 has parallel output channels 21, 22, 23, 24 being connected to a CFA. The CFA has a kernel of four pixels such as the Bayer pattern connection matrix of FIG. 1. The image sensor 20 illustrated in FIG. 2a has a basic difference to the prior art image sensor 9 shown in FIG. 1 in that each of the four pixels 1, 2, 3, 4 in the kernel is connected to one of the separate output channels 21, 22, 23, 24 such that all pixels 1 are connected to conductive traces 11 connecting pixels 1 with the output channel 21. Pixels 2, 3 and 4 are connected in a similar manner to output channels 22, 23, 24 through conductive traces 12, 13, and 14. Conductive traces 11, 12, 13, 14 connect to each of the pixels 1, 2, 3, 4 through vias 66. This connection through the vias 66 is envisioned as being one that can be hardwired when the image sensor 20 is originally manufactured, or made to be configurable in a variety of ways.

Figure 2B:
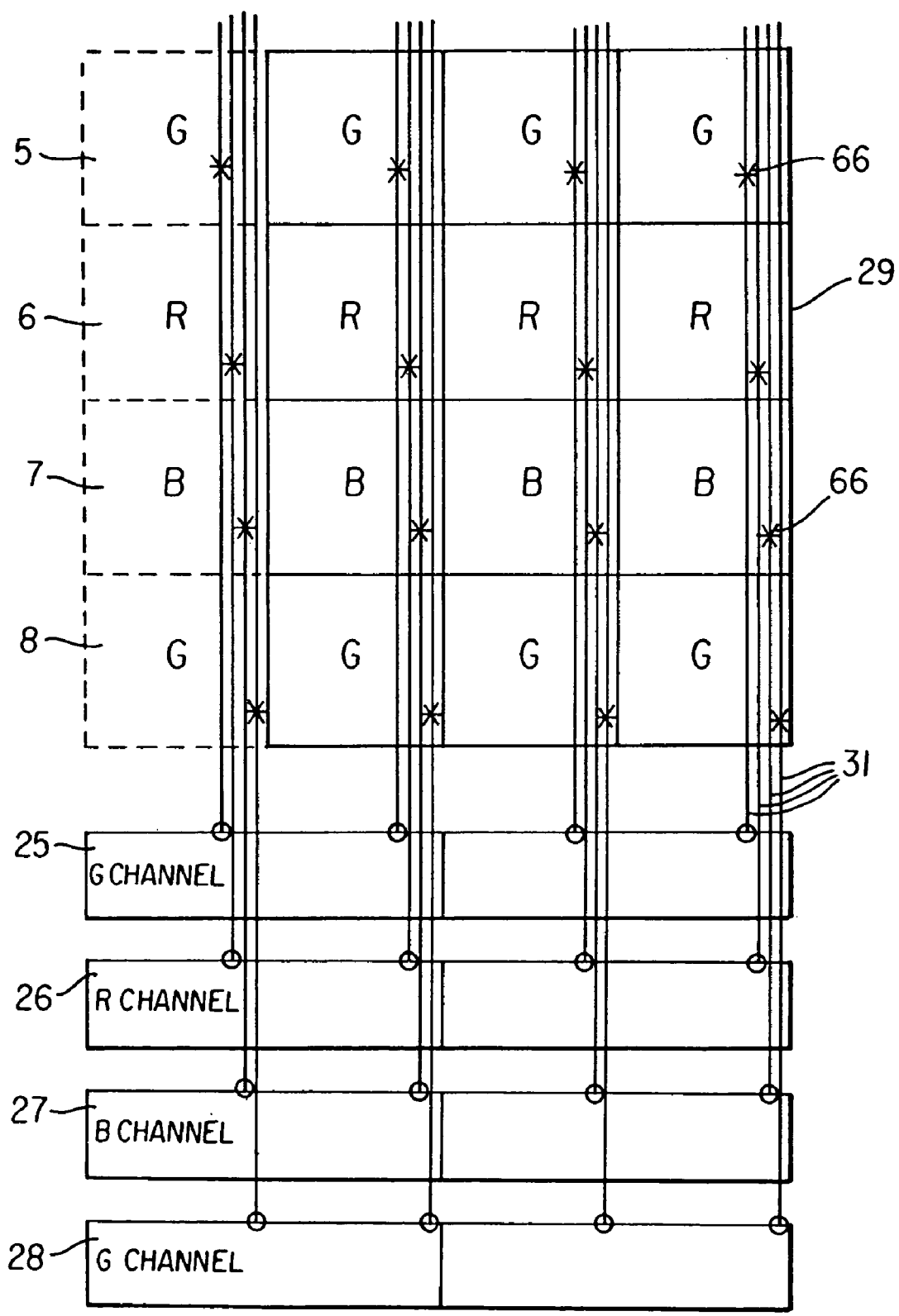
FIG. 2*b* is an alternative CFA pattern where the kernel is stripes of the color occupying an entire row. The number of column busses required is increased to four. To change to a Bayer pattern, only two of these column busses are used.

FIG. 2b is an alternative CFA pattern where the kernel is formed as stripes of the color occupying entire rows 5, 6, 7, 8. The number of column busses required is increased to four. To change to a Bayer pattern, like that of the sensor shown in FIG. 2a, the vias 66 would be created to connect only two of these column busses leaving the remaining column busses unused. Image sensor 29 has parallel output channels 25, 26, 27, 28 being connected to a CFA of image sensor 29. The CFA has a kernel of four pixels arranged in rows 5, 6, 7, 8 such that each of the rows 5, 6, 7, 8 of pixels in the kernel is connected to one of the separate output channels 25, 26, 27, 28. Each of the pixels within the rows 5 6, 7, 8 are connected to conductive traces 31 that connect the pixels with the output channels 24, 25, 26, 27 through vias 66. This connection through the vias 66 is envisioned as being one that can be hardwired when the image sensor 29 is originally manufactured, or made to be configurable in a variety of ways.

Figure 2C:
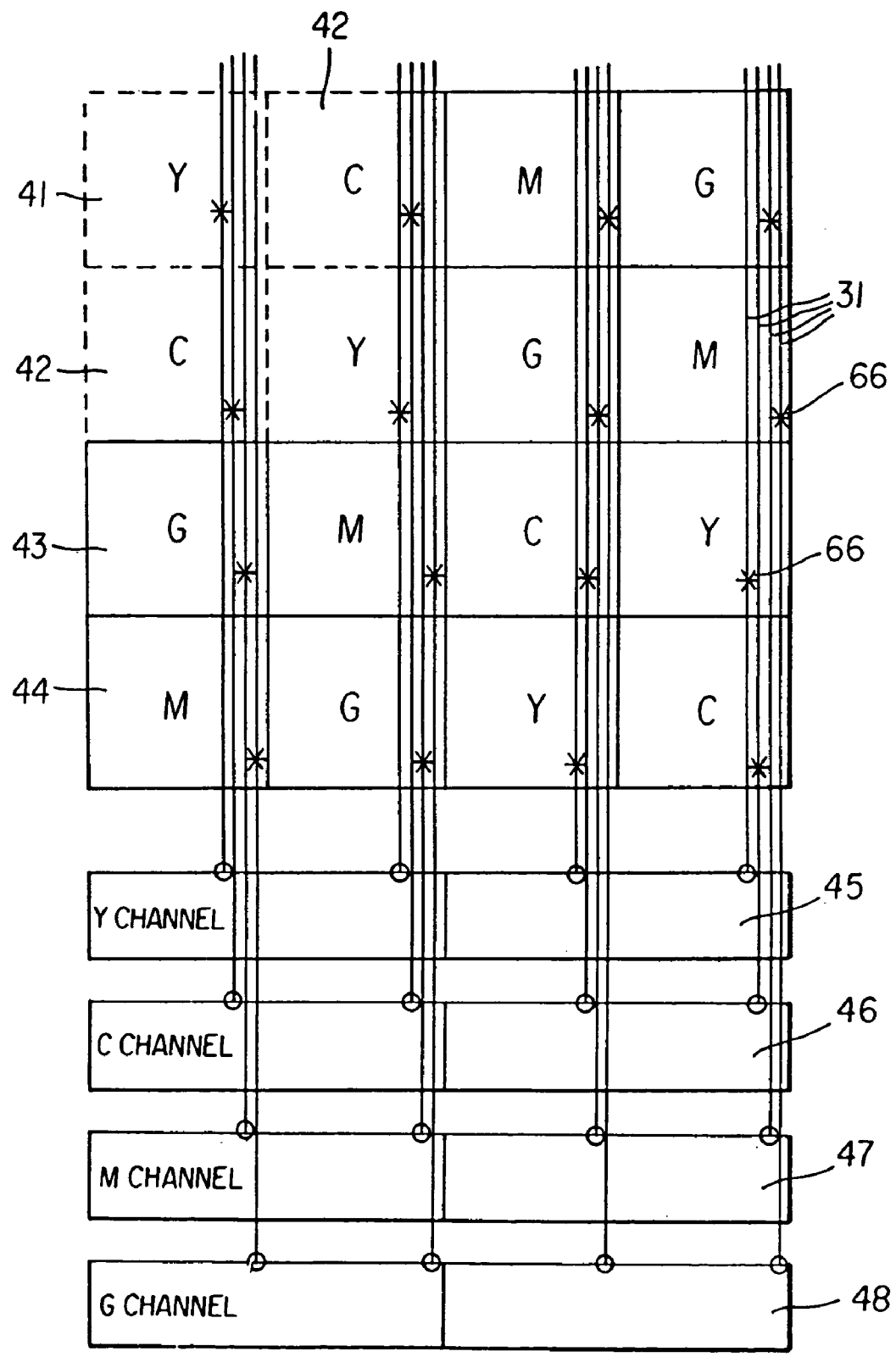
FIG. 2*c* is a similar four column-bus arrangement as shown in FIG. 2*b* "reconfigured" to allow this 4×4 color mosaic pattern to be wired for color-specific output channels. An example of such a 4×4 pattern is given in U.S. Pat. No. 5,631,703 by Hamilton et al.

FIG. 2c illustrates that the same four column-bus arrangement shown in FIG. 2b can be "reconfigured" using minimal interconnect masking changes to allow this 4×4 color mosaic pattern to be wired for color-specific output channels. The pattern shown in FIG. 2c is a complementary color pattern having yellow color filters Y, cyan color filters C, magenta color filters M, and green color filters G. Each of the pixels within the pixels 41, 42, 43, 44 are connected to conductive traces 31 to output channels 45, 46, 47, 48 through vias 66.

Figure 2D:
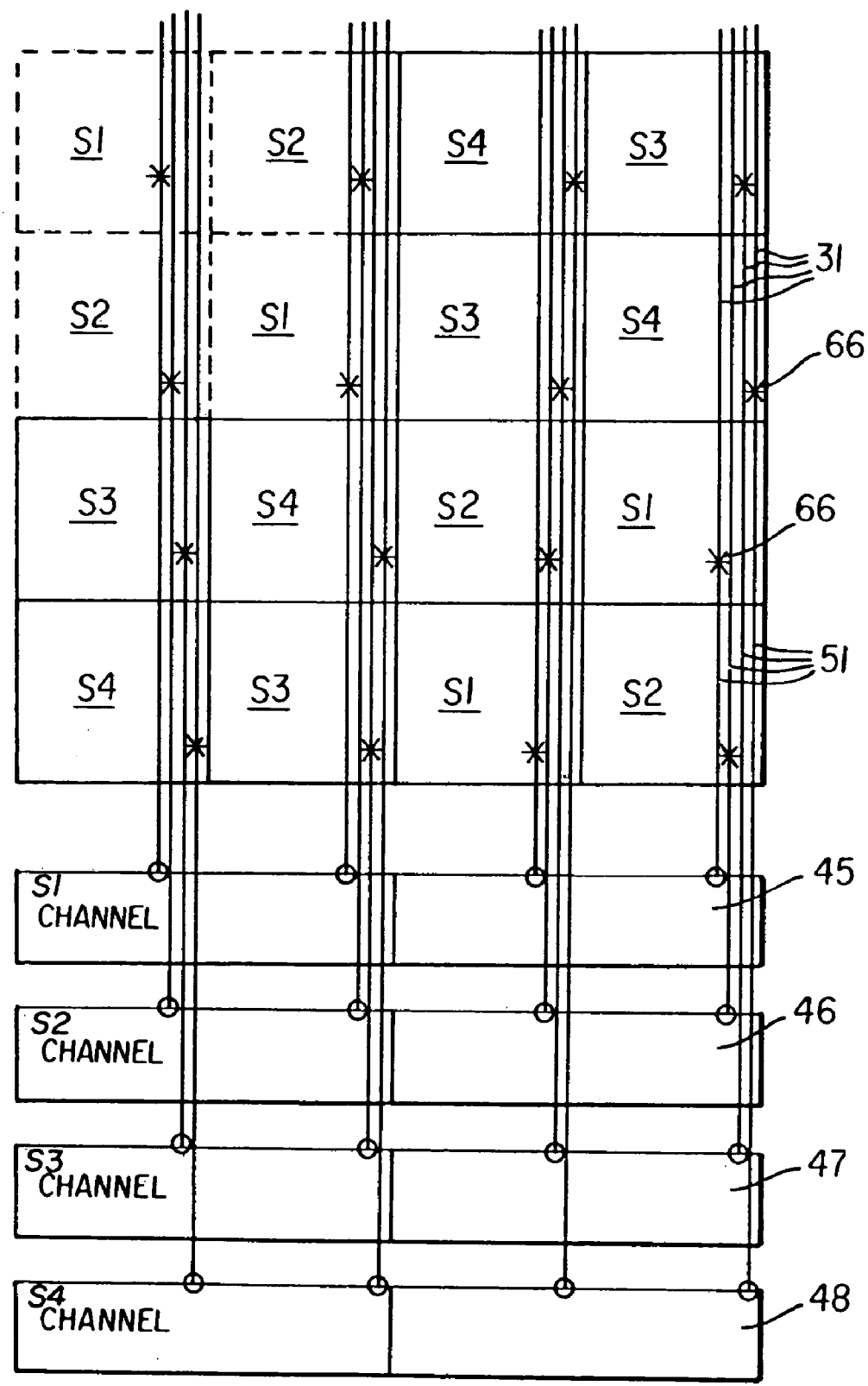
FIG. 2*d* is a similar four column-bus arrangement as shown in FIGS. 2*b* and 2*c* above that is "reconfigured" for a mosaic pattern based on a pixel pattern having different sensitivities with sensitivity specific output channels.

FIG. 2d is a similar four column-bus arrangement as shown in FIGS. 2b and 2c above that is "reconfigured" for a mosaic pattern based on pixel sensitivities and with sensitivity specific output channels. As seen in FIG. 2d there are four pixel sensitivities S1, S2, S3, S4 connected to conductive traces 51 through vias 66 to output channels 45, 46, 47 and 48.

Figure 3C:
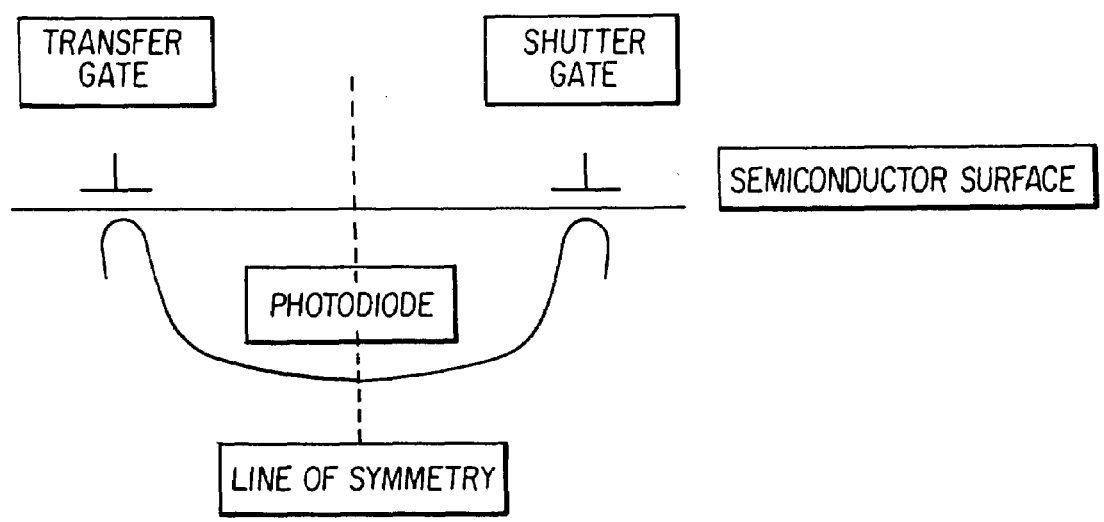
FIG. 3*c* is a cross section for a prior art device illustrating a non-symmetrical arrangement of the transfer gate and the shutter gate with a corresponding uneven potential path from the center of photodiode to these gates.

In high frame rate imaging, it is also desirable to have all the pixels be exposed to a scene simultaneously with the timing controlled electronically. In a Charge-Coupled Device (CCD) image sensor, this is typically accomplished by using a vertical over-flow drain (VOD). In CMOS APS, this would add complex processing steps and therefore add cost. The present invention discloses the use of an additional shutter gate transistor in the pixel design to allow reset of the photo-diode collection node independently of the transfer gate and reset gate of the floating diffusion sensing node. The design of this electronic shutter gate is such that the layout of the photo-diode is symmetric with respect to the two transistor gates performing either a transfer of the collected photo-carriers into a sensing node (the transfer gate) or a reset node (electronic shutter gate). Using this dual gated photo-diode and by connecting them for all the pixels in the array globally, the timed exposure of the pixels are determined by the time interval between the global reset of the photo-diodes and the global transfer of the photo charges to the sensing node. This design is illustrated in FIGS. 3a–c.

The present invention has advantages in: (1) accommodate changes in pixel output groupings for different monochrome output format or CFA patterns with only changes in metal routing layers; (2) allowing true electronic shuttering to image moving scene with all the pixels having the same capture time windows; and (3) providing symmetric global shutter gate and transfer gate to minimize pixel related fixed pattern noise. These have been described in detail with particular reference the embodiment most preferred, but it will be understood that variations and modifications can be effected that are obvious to those skilled within art. Accordingly, the breadth of the invention should be measured by the appended claims.

PARTS LIST 1 pixel
2 pixel
3 pixel
4 pixel
5 row
6 row
7 row
8 row
9 image sensor
10 unit kernel
11 conductive traces
12 conductive traces
13 conductive traces
14 conductive traces
20 image sensor
21 output channel
22 output channel
23 output channel
24 output channel
25 output channel
26 output channel
27 output channel
28 output channel
29 image sensor
31 conductive traces
41 pixel
42 pixel
43 pixel
44 pixel
45 output channel
46 output channel
47 output channel
48 output channel
51 conductive traces
61 vias
62 vias
63 vias
64 vias
66 vias
70 pixel
71 transfer gate
72 shutter gate
74 floating diffusion
76 source follower transistor
78 row select transistor
81 channel 1
82 channel 2
83 channel 3
84 channel 4
R red
G green
B blue
Y yellow
C cyan
M magenta
S1 pixel sensitivity
S2 pixel sensitivity
S3 pixel sensitivity
S4 pixel sensitivity

What is claimed is:

1. An image sensing device comprising:
a semiconductor substrate having an array of pixels formed in a two-dimensional mosaic;
at least one of the pixels comprising a photodetector in electrical communication with a transfer gate and a shutter gate, which shutter gate functions to reset the photodetector independent of the transfer gate and reset gate of a floating diffusion node, wherein the transfer gate and the shutter gate are equidistantly spaced from an electrostatic center of the pixel; wherein a fixed noise pattern is minimized by the equidistant spacing; and
wherein the reset gate resets the floating diffusion to a potential.

2. The image sensing device of claim 1 where the two-dimensional mosaic of pixels is arranged in rows and columns.

3. The image sensing device of claim 1 further comprising at least one active circuit element interfaced to the photodetector.

4. The image sensing device of claim 1 further comprising a sense node to receive charge from the transfer gate and an amplifier interfaced to the sense node.

5. The image sensing device of claim 1 further comprising a global shuttering means for activating the shutter gate.

6. The image sensing device of claim 4 further comprising a row select transistor coupled to the amplifier.

7. The image sensing device of claim 1, wherein the transfer gate is connected to the photodetector at a first location and the shutter gate is connected to the photodetector at a second location spaced from the first location.

8. An active pixel sensor comprising:
a semiconductor substrate having an array of pixels formed in rows and columns;

each pixel comprising a photodetector in electrical communication with a transfer gate and a shutter gate, which shutter gate functions to reset the photodetector independent of the transfer gate and reset gate of a floating diffusion node, a reset gate for resetting a floating diffusion to a potential, and an amplifier operatively connected to receive charge from the photodetector wherein the transfer gate and the shutter gate are equidistantly spaced from an electrostatic center of the pixel, wherein a fixed noise pattern is minimized by the equidistant spacing.

9. The active pixel sensor of claim 8 further comprising a sense node to receive charge from the transfer gate wherein the amplifier is interfaced to the sense node.

10. The active pixel sensor of claim 8 further comprising a global shuttering means for simultaneously activating each of the shutter gates.

11. The active pixel sensor of claim 8 further comprising a row select transistor coupled to each of the amplifiers.

12. The active pixel sensor of claim 8 further comprising a plurality of output channels, each of the output channels being operatively connected to a subset of pixels for at least one of the columns.

13. The active pixel sensor of claim 12 wherein each of the subsets has pixels of one sensitivity.

14. The active pixel sensor of claim 13 wherein each of the output channels is selectively connected to the subset of pixels by at least one contact to at least one of a plurality of conductive traces.

15. The active pixel sensor of claim 8 wherein each of the pixels has a pinned photo-diode as the photodetector.

16. The active pixel sensor of claim 8 wherein the transfer mechanism is connected to the photodetector at a first location and the shutter gate is connected to the photodetector at a second location spaced from the first location.

17. A method of making an active pixel sensor comprising:

forming on a semiconductor substrate a two dimensional array of pixels each pixel comprising a photodetector in electrical communication with a transfer gate and a shutter gate, which shutter gate functions to reset the photodetector independent of the transfer gate and reset gate of a floating diffusion node, and an amplifier operatively connected to receive charge from the photodetector;

forming a reset gate for resetting a floating diffusion to a potential; and equidistantly spacing the transfer gate and the shutter gate from an electrostatic center of the pixel, wherein a fixed noise pattern is minimized by the equidistant spacing.

18. The method of claim 17 wherein the pixel further comprises a sense node to receive charge from the transfer mechanism with the amplifier interfaced to the sense node.

19. The method of claim 17 comprising coupling a global shuttering means to each of the shutter gates for simultaneously activating each of the shutter gates.

20. The method of claim 17 comprising coupling a row select transistor to the amplifier.

21. The method of claim 17 comprising operatively connecting an output channel to a subset of pixels within a column of the two dimensional array.

22. The method of claim 21 wherein the subset of pixels comprises pixels of one sensitivity.

23. The method of claim 22 wherein the output channel is selectively connected to the subset of pixels by at least one contact and at least one conductive trace.

* * * * *